(12) United States Patent
Kojima et al.

(10) Patent No.: US 10,418,478 B2
(45) Date of Patent: Sep. 17, 2019

(54) SEMICONDUCTOR DEVICE

(71) Applicant: FUJI ELECTRIC CO., LTD., Kawasaki-shi, Kanagawa (JP)

(72) Inventors: Takahito Kojima, Matsumoto (JP); Shinsuke Harada, Tsukuba (JP); Yasuhiko Oonishi, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/961,013

(22) Filed: Apr. 24, 2018

(65) Prior Publication Data

US 2018/0350975 A1 Dec. 6, 2018

(30) Foreign Application Priority Data

May 31, 2017 (JP) ................. 2017-108592

(51) Int. Cl.

| H01L 29/00 | (2006.01) |
|---|---|
| H01L 29/78 | (2006.01) |
| H01L 29/10 | (2006.01) |
| H01L 29/16 | (2006.01) |
| H01L 29/423 | (2006.01) |
| H01L 29/66 | (2006.01) |
| H01L 29/06 | (2006.01) |
| H01L 29/08 | (2006.01) |

(52) U.S. Cl.
CPC ...... *H01L 29/7813* (2013.01); *H01L 29/0623* (2013.01); *H01L 29/0878* (2013.01); *H01L 29/1095* (2013.01); *H01L 29/1608* (2013.01); *H01L 29/42376* (2013.01); *H01L 29/66068* (2013.01)

(58) Field of Classification Search
None
See application file for complete search history.

(56) References Cited

U.S. PATENT DOCUMENTS

2016/0247910 A1* 8/2016 Suzuki .............. H01L 29/66068
2017/0301792 A1* 10/2017 Konrath ............. H01L 21/3086

FOREIGN PATENT DOCUMENTS

JP 2014-056882 A 3/2014

* cited by examiner

*Primary Examiner* — Reema Patel
(74) *Attorney, Agent, or Firm* — Rabin & Berdo, P.C.

(57) ABSTRACT

On a surface of an n-type silicon carbide epitaxial layer on an $n^+$-type silicon carbide substrate, first and second $p^+$-type base regions are formed in the n-type silicon carbide epitaxial layer, an n-type region is formed in the n-type silicon carbide epitaxial layer, a p-type base layer is formed on the n-type region, an $n^+$-type source region and a $p^{++}$-type contact region are formed in the p-type base layer, and a trench is formed to a position shallower than the second $p^+$-type base region and penetrates the p-type base layer. A first sidewall angle of the trench at a position of the p-type base layer is 80° to 90° with respect to a main surface. A difference of the first sidewall angle and a second sidewall angle of the trench at a position deeper than a boundary of the p-type base layer and the n-type region is 1° to 25°.

12 Claims, 4 Drawing Sheets

SEMICONDUCTOR DEVICE

CROSS REFERENCE TO RELATED APPLICATIONS

This application is based upon and claims the benefit of priority of the prior Japanese Patent Application No. 2017-108592, filed on May 31, 2017, the entire contents of which are incorporated herein by reference.

BACKGROUND OF THE INVENTION

1. Field of the Invention

Embodiments of the invention relate to a semiconductor device such as a vertical MOSFET that uses a wide bandgap semiconductor material and has a trench structure.

2. Description of the Related Art

In a vertical MOSFET, the cell density per unit surface area may be increased to a greater extent with a trench structure in which the channel is formed orthogonally with respect to the substrate surface as compared to a planar structure in which the channel is formed parallel to the substrate surface and therefore, from the perspective of cost, is advantageous.

In a trench structure, as the angle of the sidewall of the trench approaches perpendicularity to a main surface, channel mobility increases, and increased current density and decreased ON resistance are facilitated. On the other hand, when the trench is formed by plasma dry etching to achieve a sidewall that is nearly perpendicular, the curvature of the corners of the bottom of the trench decreases, whereby a problem arises in that breakdown voltage decreases due to electric field concentration.

When trench formation conditions are set so that the curvature of the bottom of the trench is large, the angle of the sidewall of the trench tends to be obtuse, leading to a problem of decreased mobility. Further, when the angle of the sidewall of the trench is nearly perpendicular and a deposited oxide film is used for a gate oxide film, the thickness of the deposited gate oxide film decreases with proximity to the bottom of the trench and the gate oxide film is easily destroyed at locations where the gate oxide film is thin.

Conventionally, a structure has been proposed in which the angle of the sidewall of a trench part is sloped in 2 stages (for example, refer to Japanese Laid-Open Patent Publication No. 2014-56882).

SUMMARY OF THE INVENTION

According to an embodiment of the present invention, a semiconductor device includes a first wide bandgap semiconductor layer of a first conductivity type and having a low concentration, the first wide bandgap semiconductor layer being formed on a surface of a wide bandgap semiconductor substrate of the first conductivity type, the wide bandgap semiconductor substrate having a high concentration; a first base region of a second conductivity type selectively formed in a surface of the first wide bandgap semiconductor layer; a second base region of the second conductivity type selectively formed in the first wide bandgap semiconductor layer; a second wide bandgap semiconductor layer of the second conductivity type selectively formed on a surface of a first side of the first wide bandgap semiconductor layer opposite a second side of the first wide bandgap semiconductor layer, the second side facing the wide bandgap semiconductor substrate; a source region of the first conductivity type selectively formed in a surface layer of the second wide bandgap semiconductor layer; a contact region of the second conductivity type; a trench formed to a position shallower than a position of the second base region, the trench penetrating the second wide bandgap semiconductor layer; and a gate electrode, at least a part of the gate electrode being formed in the trench. The trench has a first sidewall angle at a position of the second wide bandgap semiconductor layer, and a second sidewall angle at a position deeper than a boundary of the second wide bandgap semiconductor layer and the first wide bandgap semiconductor layer. The first sidewall angle and the second sidewall angle differ from each other. The first sidewall angle is 80° to 90° with respect to a main surface, and a difference of the first sidewall angle and the second sidewall angle is 1° to 25°.

According to an embodiment of the present invention, a semiconductor device includes a first wide bandgap semiconductor layer of a first conductivity type and having a low concentration, the first wide bandgap semiconductor layer being formed on a surface of a wide bandgap semiconductor substrate of the first conductivity type, the wide bandgap semiconductor substrate having a high concentration; a first base region of a second conductivity type selectively formed in a surface of the first wide bandgap semiconductor layer; a second base region of the second conductivity type selectively formed in the first wide bandgap semiconductor layer; a second wide bandgap semiconductor layer of the second conductivity type selectively formed on a surface of a first side of the first wide bandgap semiconductor layer opposite a second side of the first wide bandgap semiconductor layer, the second side facing the wide bandgap semiconductor substrate; a source region of the first conductivity type selectively formed in a surface layer of the second wide bandgap semiconductor layer; a contact region of the second conductivity type; a trench formed shallower than the second base region, the trench penetrating the second wide bandgap semiconductor layer; a gate insulating film formed along a surface of the trench on a bottom and a side part of the trench; a gate electrode insulated from the first wide bandgap semiconductor layer and the second wide bandgap semiconductor layer by the gate insulating film, at least a part of the gate electrode being formed in the trench; an interlayer insulating film formed on the gate electrode; a source electrode common to and in contact with surfaces of the source region and the contact region of the second conductivity type; and a drain electrode provided on a rear surface of the wide bandgap semiconductor substrate. The trench penetrates the source region, the contact region of the second conductivity type, and the second wide bandgap semiconductor layer. The trench is formed to a position shallower than the second base region. Angles of a sidewall of the trench include, with respect to a main surface, a first sidewall angle at a position of the second wide bandgap semiconductor layer and a second sidewall angle at a position deeper than a boundary of the second wide bandgap semiconductor layer and the first wide bandgap semiconductor layer. The first sidewall angle and the second sidewall angle differ from each other. The first sidewall angle is 80° to 90° with respect to the main surface, and a difference of the first sidewall angle and the second sidewall angle is 1° to 25°.

In the embodiments, the semiconductor device further includes a first conductivity type region provided between the first wide bandgap semiconductor layer and the second wide bandgap semiconductor layer. The first conductivity type region has an impurity concentration that is higher than an impurity concentration of the first wide bandgap semiconductor layer. The first base region and the second base region are in the first conductivity type region.

In the embodiments, the second sidewall angle of the trench is 65° to 89° with respect to the main surface.

In the embodiments, the difference of the first sidewall angle and the second sidewall angle is 15° to 25°.

In the embodiments, a depth position of the first base region and a depth position of the second base region are a same position.

In the embodiments an impurity concentration of the first base region and an impurity concentration of the second base region are a same impurity concentration.

In the embodiments, the wide bandgap semiconductor material is silicon carbide.

Objects, features, and advantages of the present invention are specifically set forth in or will become apparent from the following detailed description of the invention when read in conjunction with the accompanying drawings.

DETAILED DESCRIPTION OF THE INVENTION

Figure 1:
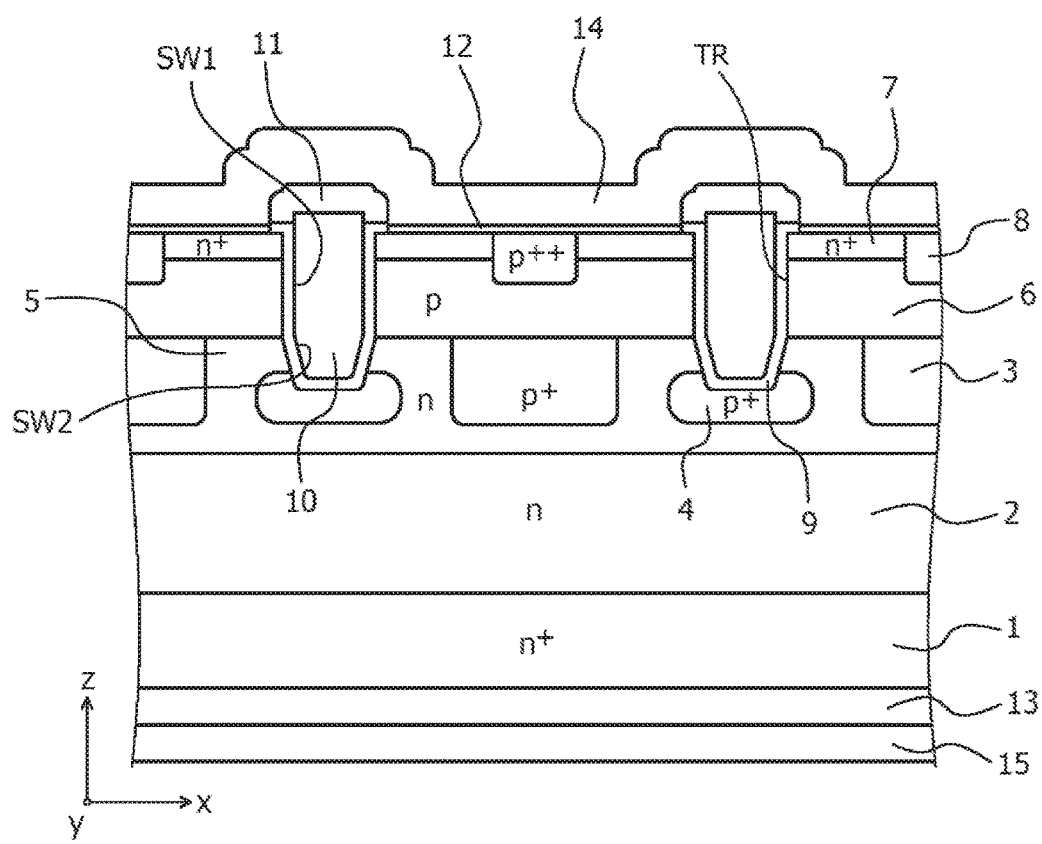
FIG. 1 is a cross-sectional view of a silicon carbide semiconductor device according to the embodiment.

First, a problem associated with the prior art above is discussed. While Japanese Laid-Open Patent Publication No. 2014-56882 proposes a structure in which the angle of the sidewall of the trench part has 2 stages, the structure concentrates electric field at the bottom (corners) of the trench part, which decreases the breakdown voltage.

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. Cases where symbols such as n's and p's that include + or − are the same indicate that concentrations are close and therefore, the concentrations are not necessarily equal. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index.

The semiconductor device according to an embodiment is configured using a wide bandgap semiconductor material. In the embodiment, a MOS silicon carbide semiconductor device fabricated using, for example, silicon carbide (SiC) as a wide bandgap semiconductor material will be described as an example.

FIG. 1 is a cross-sectional view of a silicon carbide semiconductor device according to the embodiment. As depicted in FIG. 1, in the silicon carbide semiconductor device according to the embodiment, an n-type silicon carbide epitaxial layer (first wide bandgap semiconductor layer) 2 is deposited on a first main surface, e.g., (0001) plane, (Si face), of an $n^+$-type silicon carbide substrate (wide bandgap semiconductor substrate) 1.

The $n^+$-type silicon carbide substrate 1 is a silicon carbide single crystal substrate doped with, for example, nitrogen (N). The n-type silicon carbide epitaxial layer 2 is a low-concentration n-type drift layer that is doped with, for example, nitrogen and that has an impurity concentration that is lower than an impurity concentration of the $n^+$-type silicon carbide substrate 1. An n-type region 5 of a high concentration is formed in a first main surface side of the n-type silicon carbide epitaxial layer 2. The n-type region 5 of a high concentration is doped with, for example, nitrogen and has an impurity concentration that is lower than the impurity concentration of the $n^+$-type silicon carbide substrate 1 and higher than the impurity concentration of the n-type silicon carbide epitaxial layer 2. Hereinafter, the $n^+$-type silicon carbide substrate 1 alone, or the $n^+$-type silicon carbide substrate 1 and the n-type silicon carbide epitaxial layer 2, or the $n^+$-type silicon carbide substrate 1, the n-type silicon carbide epitaxial layer 2 and a p-type base layer 6 (described later, second wide bandgap semiconductor layer) collectively are regarded as a silicon carbide semiconductor base.

As depicted in FIG. 1, a rear electrode 13 is provided on a surface (rear surface of the silicon carbide semiconductor base) on a first side of the $n^+$-type silicon carbide substrate 1 opposite a second side of the $n^+$-type silicon carbide substrate 1, the second side facing the n-type silicon carbide epitaxial layer 2. The rear electrode 13 constitutes a drain electrode. Reference numeral 15 represents a drain electrode pad.

A trench structure is formed in the first main surface side of the silicon carbide semiconductor base. In particular, a trench TR penetrates the p-type base layer 6 from a surface on a first side (first main surface side of the silicon carbide semiconductor base) of the p-type base layer 6 opposite a second side of the p-type base layer 6, the second side facing toward the $n^+$-type silicon carbide substrate 1. Along a surface of the trench, a gate insulating film 9 is formed on a bottom and side part of the trench. A gate electrode 10 that is insulated from the n-type silicon carbide epitaxial layer 2 and the p-type base layer 6 by the gate insulating film 9 is formed in the trench. A part of the gate electrode 10 may protrude outside the trench.

A first $p^+$-type base region (first base region) 3 and a second $p^+$-type base region (second base region) 4 are selectively formed in a surface layer on a first side (first main surface side of the silicon carbide semiconductor base) of the n-type silicon carbide epitaxial layer 2 opposite a second side of the n-type silicon carbide epitaxial layer 2, the second side facing the $n^+$-type silicon carbide substrate 1. The second $p^+$-type base region 4 is formed below the trench and a width of the second $p^+$-type base region 4 is at least a width of the trench. The first p$^+$-type base region 3 and the second p$^+$-type base region 4 are doped with, for example, aluminum.

A part of the first p$^+$-type base region 3 may extend toward the trench to be connected to the second p$^+$-type base region 4. The reason for this is that at a junction part of the n-type silicon carbide epitaxial layer 2 and the second p$^+$-type base region 4 under the trench, holes generated at the time of avalanche breakdown are efficiently migrated to a source electrode, thereby reducing the load on the gate insulating film 9 and increasing reliability.

On the first main surface side of the n-type silicon carbide epitaxial layer 2, the p-type base layer 6 is provided and in a first main surface side of the p-type base layer 6, an n$^+$-type source region 7 and a p$^{++}$-type contact region 8 are provided. The n$^+$-type source region 7 and the p$^{++}$-type contact region 8 are in contact with each other. Further, in a region of a surface layer of the n-type silicon carbide epitaxial layer 2 between the first p$^+$-type base region 3 and the second p$^+$-type base region 4, and in a region thereof between the p-type base layer 6 and the second p$^+$-type base region 4, the n-type region 5 of a high concentration is provided. The n-type region 5 of a high concentration is formed to a position deeper than depths of the first p$^+$-type base region 3 and the second p$^+$-type base region 4.

In FIG. 1, although only 2 trench MOS structures are depicted, more trench MOS structures may be further arranged in parallel.

An interlayer insulating film 11 covers the entire surface of the first main surface side of the silicon carbide semiconductor base and a top of the gate electrode 10 embedded in the trench, and is provided so as to have an opening between trenches. A source electrode 12 is in contact with the n$^+$-type source region 7 and the p$^{++}$-type contact region 8, via a contact hole opened in the interlayer insulating film 11. The source electrode 12 is electrically insulated from the gate electrode 10 by the interlayer insulating film 11. On the source electrode 12, a source electrode pad 14 is provided.

Here, a sidewall angle $A_{SW1}$ of a trench sidewall SW1 is assumed to be 80° to 90° with respect to a main surface in a region of the p-type base layer 6; the closer to 90°, the more ideal the angle is. Further, a sidewall angle $A_{SW2}$ of a trench sidewall SW2 in the n-type region 5 of a high concentration is assumed to be 65° to 89° with respect to the main surface. The sidewall angles $A_{SW1}$, $A_{SW2}$ of the trench sidewalls SW1, SW2 are formed so as to differ from each other.

Further, the trench is formed so that the sidewall angles $A_{SW1}$, $A_{SW2}$ of the trench sidewalls SW1, SW2 satisfy $A_{SW1} > A_{SW2}$ and the difference of the sidewall angles $A_{SW1}$, $A_{SW2}$ of the trench sidewalls SW1, SW2 ($A_{SW1}$-$A_{SW2}$) is assumed to be 1°≤$A_{SW1}$-$A_{SW2}$≤25°. For example, the sidewall angle $A_{SW1}$ is formed to be 88° and the sidewall angle $A_{SW2}$ is formed to be 85°. As a result, high channel mobility and high breakdown voltage by mitigating electric field concentration at the trench bottom may be ensured. Further, the difference of the sidewall angles $A_{SW1}$, $A_{SW2}$ of the trench sidewalls SW1, SW2 ($A_{SW1}$-$A_{SW2}$) may satisfy 15°≤$A_{SW1}$-$A_{SW2}$≤25°. When the sidewall angle $A_{SW1}$ is formed to be 90° and the sidewall angle $A_{SW2}$ is at most 75°, mitigation of the electric field by curvature relaxation becomes easier to achieve.

Further, when a deposited oxide film, e.g., a LPCVD film, etc., is used for the gate insulating film 9, to make the deposited oxide film thicknesses of the trench sidewalls SW1, SW2 nearly uniform, the sidewall angle $A_{SW2}$ of the trench sidewall SW2 may be 85° or less. As a result, thinning of the deposited oxide film at the trench sidewall SW2 is suppressed, enabling destruction at locations where the gate oxide film is thin to be suppressed. For example, in a case of formation where the sidewall angle $A_{SW1}$ is 88° and the sidewall angle $A_{SW2}$ is 85°, the deposited oxide film thickness of the trench sidewall SW1 is 100 nm and the deposited oxide film thickness of the trench sidewall SW2 is 99 nm, whereby the difference in film thickness may be suppressed to 1% or less.

Figure 2:
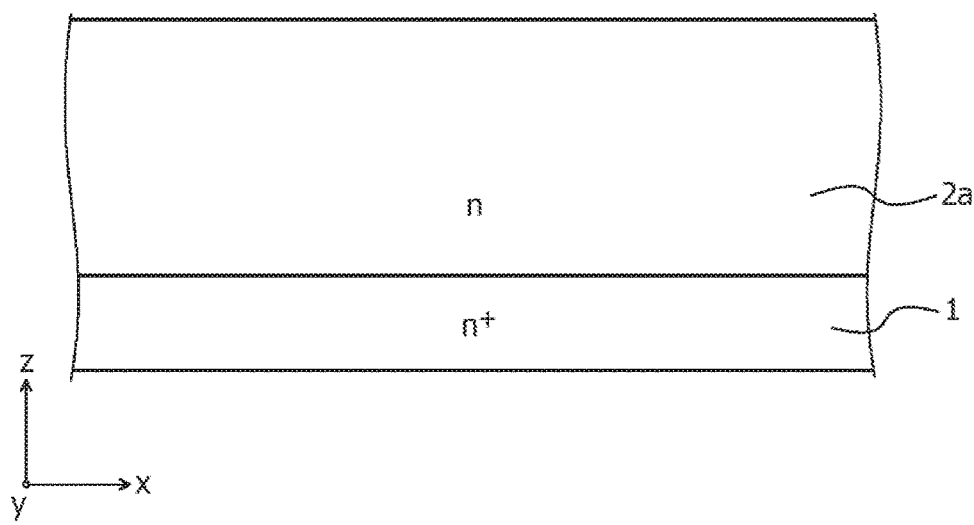
FIG. 2 is a cross-sectional view of a manufacturing process of the semiconductor device according to the embodiment.

FIGS. 2, 3, 4, 5, 6, and 7 are each a cross-sectional view of manufacturing processes of the semiconductor device according to the embodiment. Hereinafter, manufacturing processes of the silicon carbide semiconductor device depicted in FIG. 1 will be described in sequence. First, as depicted in FIG. 2, the n$^+$-type silicon carbide substrate 1 containing an n-type silicon carbide is prepared. Subsequently, on the first main surface of the n$^+$-type silicon carbide substrate 1, a first n-type silicon carbide epitaxial layer 2a containing silicon carbide is formed by epitaxial growth to a thickness of about, for example, 10 μm while an n-type impurity (e.g., nitrogen atoms) is doped. The first n-type silicon carbide epitaxial layer 2a corresponds to a part (lower layer) of the n-type silicon carbide epitaxial layer 2. The state up to here is depicted in FIG. 2.

Figure 3:
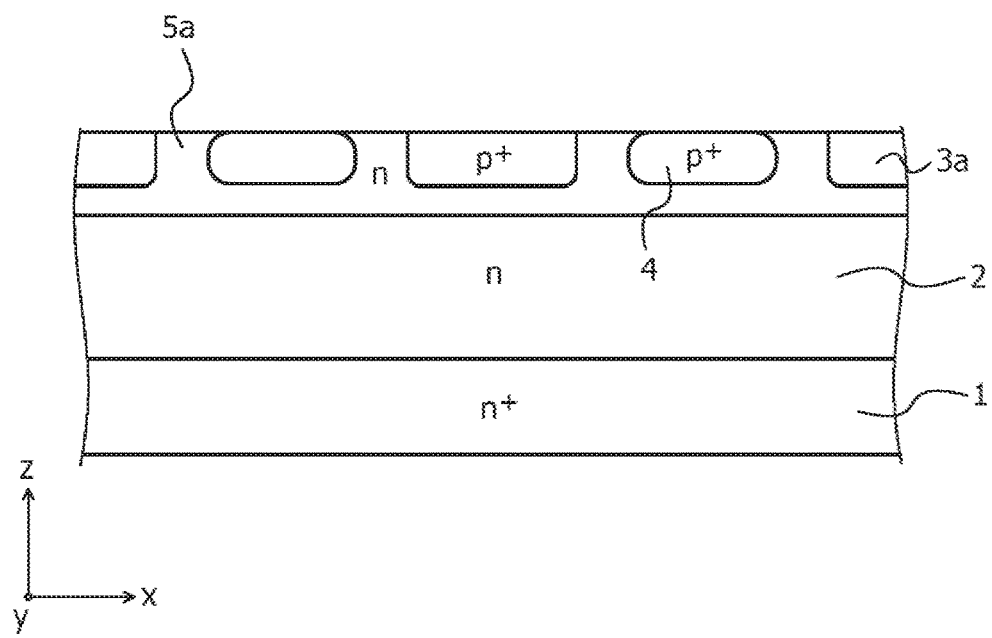
FIG. 3 is a cross-sectional view of a manufacturing process of the semiconductor device according to the embodiment.

Next, as depicted in FIG. 3, on a surface of the first n-type silicon carbide epitaxial layer 2a, a non-depicted mask having predetermined openings is formed by a photolithographic technique, using, for example, an oxide film. Subsequently, a p-type impurity (e.g., aluminum atoms) is ion implanted. As a result, as depicted in FIG. 3, in a part of a surface region of the first n-type silicon carbide epitaxial layer 2a, a first p$^+$-type base region 3a and the second p$^+$-type base region 4 are formed at a deep position at a depth of about, for example, 0.5 μm.

For example, a distance between the first p$^+$-type base region 3a and the second p$^+$-type base region 4 at adjacent deep positions is about 1 to 1.5 μm. Here, a width of the first p$^+$-type base region 3a is formed to be narrower than a width of the second p$^+$-type base region 4. Further, a dose amount at the time of ion implantation for forming the first p$^+$-type base region 3a and the second p$^+$-type base region 4 that are deep may be set so that, for example, the impurity concentration becomes about $1 \times 10^{18}$ to $1 \times 10^{19}$/cm$^3$.

Next, the mask used during the ion implantation for forming the first p$^+$-type base region 3a and the second p$^+$-type base region 4 is removed. Subsequently, an n-type impurity (e.g., nitrogen atoms) is ion implanted. As a result, as depicted in FIG. 3, in a part of a surface region of the first n-type silicon carbide epitaxial layer 2a, a first n-type region 5a is formed to a position that is deeper than the deep positions of the first p$^+$-type base region 3a and the second p$^+$-type base region 4. A dose amount at the time of ion implantation for forming the first n-type region 5a at the deep position may be set so that, for example, the impurity concentration becomes about $5 \times 10^{16}$ to $5 \times 10^{17}$/cm$^3$. The state up to here is depicted in FIG. 3. The first n-type region 5a corresponds to a part (lower layer) of the n-type region 5.

Figure 4:
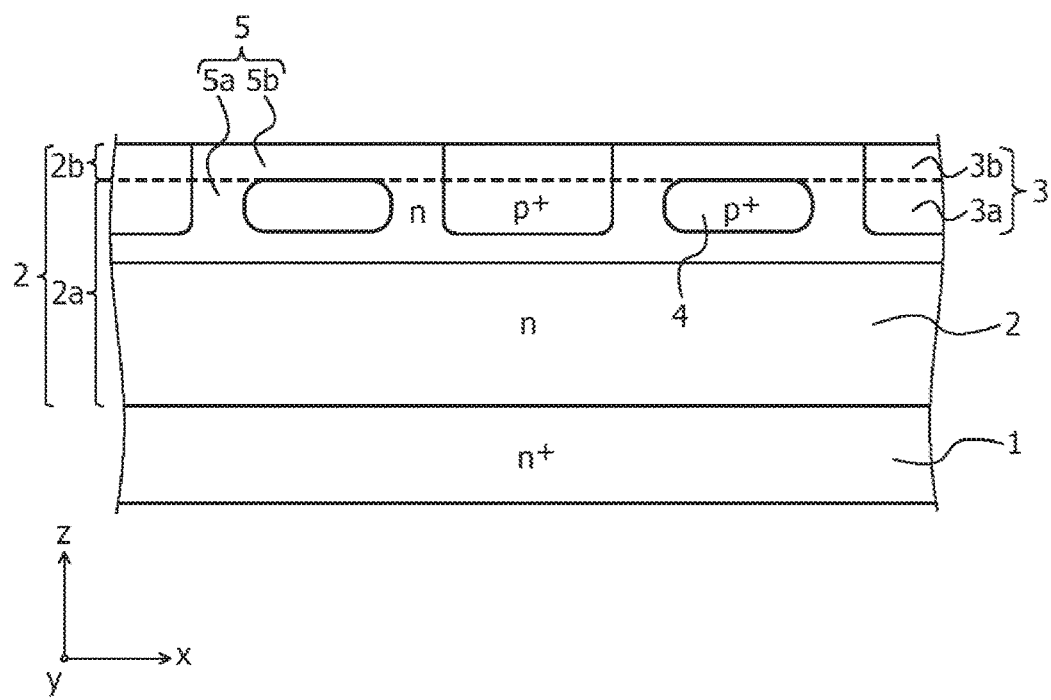
FIG. 4 is a cross-sectional view of a manufacturing process of the semiconductor device according to the embodiment.

Next, as depicted in FIG. 4, on the surface of the first n-type silicon carbide epitaxial layer 2a, a second n-type silicon carbide epitaxial layer 2b is formed by epitaxial growth to have a thickness of about, for example, 0.5 μm while an n-type impurity (e.g., nitrogen atoms) is doped. The second n-type silicon carbide epitaxial layer 2b and the first n-type silicon carbide epitaxial layer 2a collectively become the n-type silicon carbide epitaxial layer 2. Conditions of the epitaxial growth for forming the second n-type silicon carbide epitaxial layer 2b may be set so that, for example, the impurity concentration of the second n-type silicon carbide epitaxial layer 2b becomes about $8 \times 10^{15}/\text{cm}^3$.

Next, on the surface of the n-type silicon carbide epitaxial layer 2, a non-depicted mask having predetermined openings is formed by a photolithographic technique, using, for example, an oxide mask. Subsequently, a p-type impurity (e.g., aluminum atoms) is ion implanted. As a result, as depicted in FIG. 4, in a part of a surface region of the n-type silicon carbide epitaxial layer 2, the first $p^+$-type base region 3b is formed at a shallow position at a depth of about, for example, 0.5 µm, so as to overlap a top of the first $p^+$-type base region 3a.

The first $p^+$-type base region 3b provided at the shallow position and the first $p^+$-type base region 3a provided at the deep position collectively form the first $p^+$-type base region 3. A dose amount at the time of ion implantation for forming the first $p^+$-type base region 3b at the deep position may be set so that, for example, the impurity concentration becomes about $1 \times 10^{18}$ to $1 \times 10^{19}/\text{cm}^3$.

Next, the mask used during the ion implantation for forming the first $p^+$-type base region 3b at the shallow position is removed. Subsequently, an n-type impurity (e.g., nitrogen atoms) is ion implanted. As a result, as depicted in FIG. 4, in a part of a surface region of the second n-type silicon carbide epitaxial layer 2b, for example, the first n-type region 5b of a high concentration is formed at a shallow position at a depth of about 0.5 µm. A dose amount at the time of ion implantation for forming the first n-type region 5b may be set so that, for example, the impurity concentration becomes about $5 \times 10^{16}$ to $5 \times 10^{17}/\text{cm}^3$. The first n-type region 5b that is shallow and of a high concentration, and the first n-type region 5a that is deep and of a high concentration collectively become the n-type region 5 of a high concentration. The state up to here is depicted in FIG. 4.

Subsequently, on the surface of the n-type silicon carbide epitaxial layer 2, the p-type base layer 6 is formed by epitaxial growth to have a thickness of about, for example, 0.7 to 1.3 µm while a p-type impurity (e.g., aluminum atoms) is doped. Conditions of the epitaxial growth for forming the p-type base layer 6 may be set so that, for example, the impurity concentration becomes about $1 \times 10^{16}$ to $5 \times 10^{18}/\text{cm}^3$.

Figure 5:
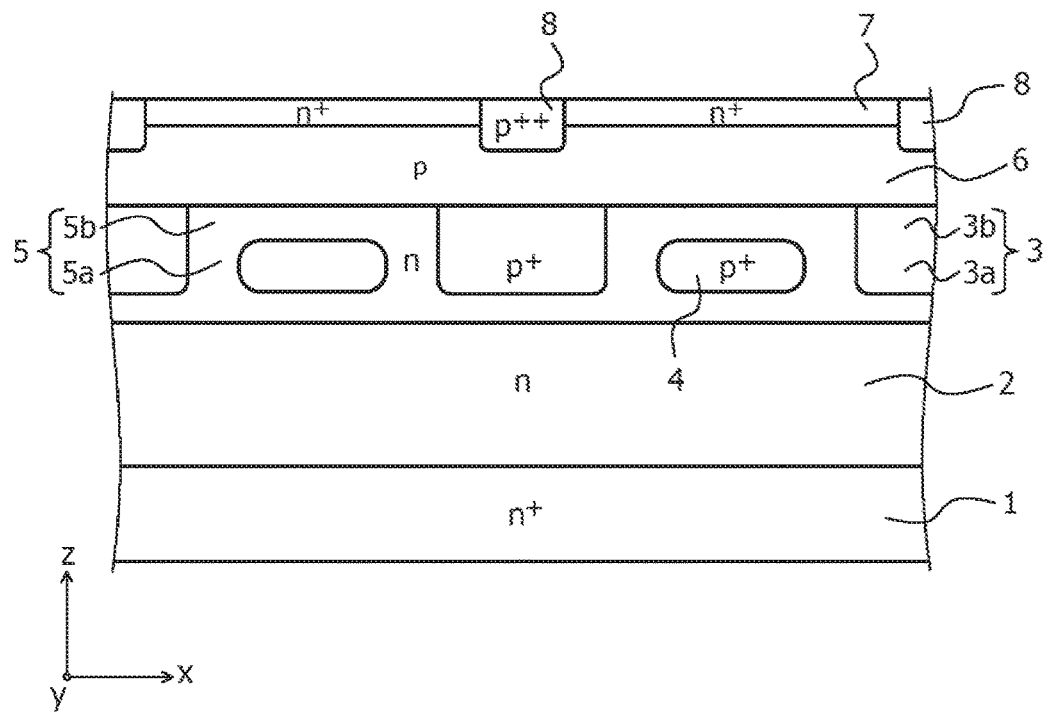
FIG. 5 is a cross-sectional view of a manufacturing process of the semiconductor device according to the embodiment.

Subsequently, on a surface of the exposed p-type base layer 6, a non-depicted mask having predetermined openings is formed by a photolithographic technique, using, for example, an oxide film. An n-type impurity (e.g., phosphorus) is ion implanted. As a result, as depicted in FIG. 5, in a part of a surface region of the p-type base layer 6, the $n^+$-type source region 7 is formed. A dose amount at the time of ion implantation for forming the $n^+$-type source region 7 may be set so that, for example, the impurity concentration becomes higher than the impurity concentration of the first $p^+$-type base region 3.

Next, the mask used during the ion implantation for forming the $n^+$-type source region 7 is removed. Subsequently, on a surface of the exposed p-type base layer 6, a non-depicted mask having predetermined openings is formed by a photolithographic technique, using, for example, an oxide film, and a p-type impurity (e.g., aluminum) is ion implanted in the surface of the p-type base layer 6. As a result, as depicted in FIG. 5, in a part of a surface region of the p-type base layer 6, the $p^{++}$-type contact region 8 is formed. A dose amount at the time of ion implantation for forming the $p^{++}$-type contact region 8 may be set so that, for example, the impurity concentration becomes higher than the impurity concentration of the second $p^+$-type base region 4. Next, the mask used during the ion implantation for forming the $p^{++}$-type contact region 8 is removed. The state up to here is depicted in FIG. 5.

Subsequently, heat treatment (annealing) is performed and, for example, the first $p^+$-type base region 3, the $n^+$-type source region 7, and the $p^{++}$-type contact region 8 are activated. A temperature of the heat treatment may be, for example, about 1700 degrees C. A period of the heat treatment may be, for example, about 2 minutes. Ion implanted regions may be collectively activated by a single heat treatment session as described, or may be activated by performing the heat treatment each time ion implantation is performed.

Figure 6:
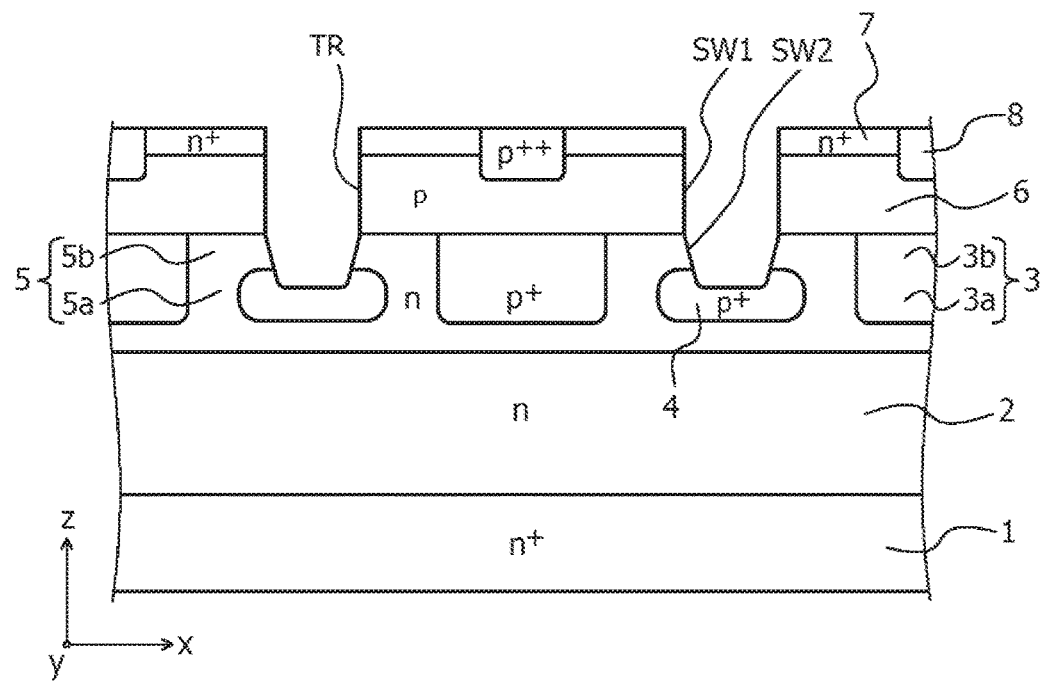
FIG. 6 is a cross-sectional view of a manufacturing process of the semiconductor device according to the embodiment.

Subsequently, as depicted in FIG. 6, on the surface of the exposed p-type base layer 6, a non-depicted mask having predetermined openings is formed by a photolithographic technique, using, for example, an oxide film. Subsequently, by dry etching, the trenches are formed to penetrate the p-type base layer 6 and reach the n-type silicon carbide epitaxial layer 2. The bottoms of the trenches may reach the second $p^+$-type base regions 4 (state depicted in FIG. 6), or may be positioned in the n-type silicon carbide epitaxial layer 2 between the p-type base layer 6 and the second $p^+$-type base regions 4. Here, the trench sidewalls SW1, SW2 are formed to have the sidewall angles $A_{SW1}$, $A_{SW2}$ described above. Subsequently, the mask used for forming the trenches is removed. The state up to here is depicted in FIG. 6.

The trench may be formed by, for example, performing dry etching so as to form a nearly perpendicular sidewall to a predetermined depth and then increasing the amount of a gas such as $SiF_4$, which has a high deposition property, whereby the sidewall toward the bottom may be angled.

Figure 7:
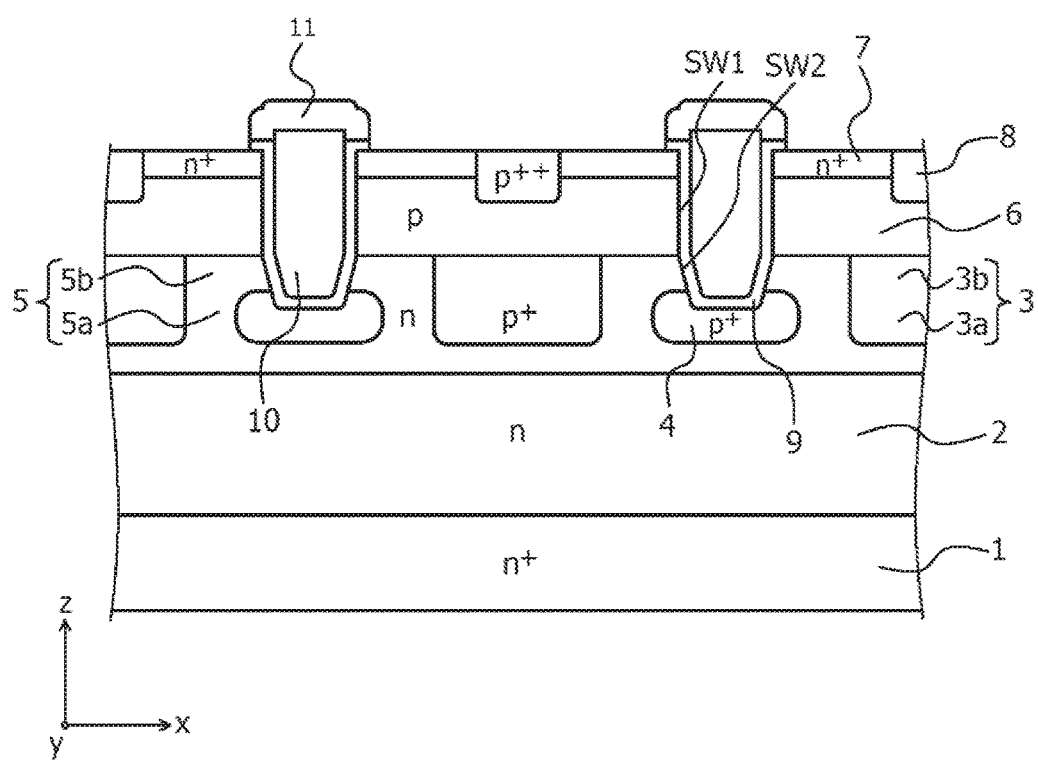
FIG. 7 is a cross-sectional view of a manufacturing process of the semiconductor device according to the embodiment.

Next, as depicted in FIG. 7, along surfaces of the $n^+$-type source region 7, the $p^+$-type contact region 8, and the trench, and on the bottom and a side part of the trenches, the gate insulating film 9 is formed. The gate insulating film 9 may be formed by thermal oxidation by heat treatment at a temperature of about 1000 degrees C. in an oxygen atmosphere. Further, the oxide film may be formed by a method of deposition by a chemical reaction such as that for a high temperature oxide (HTO).

Next, on the gate insulating film 9, a polycrystalline silicon layer doped with, for example, phosphorus atoms is formed. The polycrystalline silicon layer may be formed to be embedded in the trenches. The polycrystalline silicon layer is patterned, leaving the polycrystalline silicon layer in each of the trenches, whereby the gate electrode 10 is formed. A part of the gate electrode 10 may protrude from the trench.

Next, for example, phosphate glass is deposited to a thickness of about 1 µm and so as to cover the gate insulating film 9 and the gate electrode 10, whereby the interlayer insulating film 11 is formed. The interlayer insulating film 11 and the gate insulating film 9 are patterned and selectively removed thereby forming contact holes and exposing the $n^+$-type source region 7 and the $p^{++}$-type contact region 8. Thereafter, heat treatment (reflow) is performed, planarizing the interlayer insulating film 11. The state up to here is depicted in FIG. 7.

Next, in the contact holes and on the interlayer insulating film 11, a conductive film constituting the source electrode 12 is formed. The conductive film is selectively removed, for example, so as to leave the source electrode 12 only in the contact holes.

Next, on a second main surface of the n+-type silicon carbide substrate 1, for example, the rear (drain) electrode 13 constituted by a film containing nickel is formed. Thereafter, for example, heat treatment at a temperature of about 970 degrees C. is performed, forming an ohmic junction between the n+-type silicon carbide substrate 1 and the rear (drain) electrode 13.

Next, as depicted in FIG. 1, for example, an aluminum film is formed by, for example, sputtering so as to cover the source electrode 12 and the interlayer insulating film 11 and have a thickness of about, for example, 5 µm. Thereafter, the Al film is selectively removed so as to remain covering an active region of the element overall, whereby the source electrode pad 14 is formed.

Next, on the rear (drain) electrode 13, for example, titanium, nickel, and gold are sequentially stacked, whereby the drain electrode pad 15 is formed. In this manner, the silicon carbide semiconductor device depicted in FIG. 1 is completed.

According to the embodiment, the sidewall angle of the channel part of the trench sidewall is formed to be nearly perpendicular, and from below the channel, the sidewall angle near the trench bottom is formed to be obtuse. As a result, the curvature of the corners of the bottom of the trench may be increased, enabling a wide bandgap semiconductor device to be provided that may ensure high channel mobility and high breakdown voltage by mitigating electric field concentration at the trench bottom. Further, the structure is such that from below the channel, the sidewall angle near the trench bottom is obtuse and therefore, thinning of the deposited oxide film used for the gate insulating film of the trench may be suppressed and without thin parts in the gate insulating film of the trench, destruction of the gate insulating film may be suppressed.

In the embodiment, while the formation of the first n-type region 5b that has a high concentration and is provided at a shallow position is described to be by ion implantation, a method that omits ion implantation by setting the epitaxial growth for the second n-type silicon carbide epitaxial layer 2b so that the impurity concentration of nitrogen becomes about $5 \times 10^{16}$ to $5 \times 10^{17}/cm^3$ may be used.

In the embodiments, while a case where a main surface of the silicon carbide substrate containing silicon carbide is a (0001) plane and on the (0001) plane, a MOS is provided has been described as an example, without limitation hereto, various changes related to the wide bandgap semiconductor material, orientation of the substrate main surface, etc. are possible.

In the embodiments, while the first conductivity type is assumed to be an n-type and the second conductivity type is assumed to be a p-type, the present invention is further implemented when the first conductivity type is a p-type and the second conductivity type is an n-type.

According to the embodiments, the sidewall angle of the channel part of the trench sidewall is formed to be nearly perpendicular, and from below the channel, the sidewall angle near the trench bottom is formed to be obtuse. Further, the curvature of the corners of the bottom of the trench is formed to be large. Channel mobility is determined by the angle of the trench sidewall and therefore, a wide bandgap semiconductor device that ensures high channel mobility and that mitigates electric field concentration at the trench bottom to also ensure high breakdown voltage may be provided. Further, from below the channel, the sidewall angle near the trench bottom is obtuse, whereby thinning of the deposited oxide film used for the gate insulating film of the trench may be suppressed, enabling destruction of the gate insulating film to be suppressed.

According to the embodiments, high channel mobility, and high breakdown voltage by mitigating electric field concentration at the trench bottom may be ensured. Further, thinning of the gate insulating film of the trench may be suppressed, enabling destruction of the gate oxide film to be suppressed.

As described, the semiconductor device according to the embodiments is useful for high-voltage semiconductor devices used in power converting equipment and in power supply devices such as in various industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
a wide bandgap semiconductor substrate, being of the first conductivity type and having a main surface;
a first wide bandgap semiconductor layer, being of a first conductivity type and having an impurity concentration lower than an impurity concentration of the substrate, the first wide bandgap semiconductor layer being disposed on the main surface of the substrate and having a first side and a second side opposite to the first side, the second side of the first wide bandgap semiconductor layer facing the substrate;
a first base region of a second conductivity type, selectively disposed in the first wide bandgap semiconductor layer;
a second base region of the second conductivity type, selectively disposed in the first wide bandgap semiconductor layer;
a second wide bandgap semiconductor layer, being of the second conductivity type and being selectively disposed on the first side of the first wide bandgap semiconductor layer, the second wide bandgap semiconductor layer having a first side and a second side opposite to the first side, the second side of the second wide bandgap semiconductor layer facing the first side of the first wide bandgap semiconductor layer;
a source region, being of the first conductivity type and being selectively disposed in a surface layer of the first side of the second wide bandgap semiconductor layer;
a contact region, being of the second conductivity type and being selectively disposed in the surface layer of the first side of the second wide bandgap semiconductor layer; and
a trench structure including a gate electrode in a trench, the trench penetrating the second wide bandgap semiconductor layer and reaching the second base region, the trench having
a first sidewall, a position of which corresponds to a position in which the second wide bandgap semiconductor layer is disposed, a first angle of the first sidewall with respect to the main surface of the substrate being in a range of 80° to 90°, and
a second sidewall, a position of which corresponds to a position that is below a surface of the second side of the second wide bandgap semiconductor layer, a difference between a second angle of the second sidewall with respect to the main surface of the substrate, and the first angle being in a range of 1° to 25°, wherein the first wide bandgap semiconductor layer includes a first conductivity type region at the first side thereof, the first conductivity type region facing the second side of the second wide bandgap semiconductor layer and having an impurity concentration higher than the impurity concentration of the first wide bandgap semiconductor layer, and the first base region and the second base region are disposed in the first conductivity type region, a bottom surface of the first base region at a side facing the substrate and a bottom surface of the second base region at a side facing the substrate being located within the first conductivity type region of the first wide bandgap semiconductor layer in a depth direction thereof.

2. The semiconductor device according to claim 1, wherein the second angle is in a range of 65° to 89°.

3. The semiconductor device according to claim 1, wherein a difference between the first angle and the second angle is in a range of 15° to 25°.

4. The semiconductor device according to claim 1, wherein a bottom of the first base region and a bottom of the second base region, each having a same depth of the first wide bandgap semiconductor layer relative to a surface of the first side thereof.

5. The semiconductor device according to claim 1, wherein an impurity concentration of the first base region and an impurity concentration of the second base region are the same.

6. The semiconductor device according to claim 1, wherein each of the substrate, the first wide bandgap semiconductor layer and the second wide bandgap semiconductor layer is made of a semiconductor material including silicon carbide.

7. A semiconductor device, comprising:
a wide bandgap semiconductor substrate, being of the first conductivity type and having a main surface and a rear surface;
a first wide bandgap semiconductor layer, being of a first conductivity type and having an impurity concentration lower than an impurity concentration of the substrate, the first wide bandgap semiconductor layer being disposed on the main surface of the substrate;
a first base region of a second conductivity type, selectively disposed in the first wide bandgap semiconductor layer;
a second base region of the second conductivity type, selectively disposed in the first wide bandgap semiconductor layer;
a second wide bandgap semiconductor layer, being of the second conductivity type and being selectively disposed on the first side of the first wide bandgap semiconductor layer, the second wide bandgap semiconductor layer having a first side and a second side opposite to the first side, the second side of the second wide bandgap semiconductor layer facing the first side of the first wide bandgap semiconductor layer;
a source region, being of the first conductivity type and being selectively disposed in a surface layer of the first side of the second wide bandgap semiconductor layer;
a contact region, being of the second conductivity type and being selectively disposed in the surface layer of the first side of the second wide bandgap semiconductor layer;
a trench structure including a gate insulating film disposed along a surface of a trench, and a gate electrode disposed in the trench on the gate insulating film, at least a part of the gate electrode being disposed within the trench, the trench having
a first sidewall, a position of which corresponds to a position in which the second wide bandgap semiconductor layer is disposed, a first angle of the first sidewall with respect to the main surface of the substrate being in a range of 80° to 90°, and
a second sidewall, a position of which corresponds to a position that is below a surface of the second side of the second wide bandgap semiconductor layer, a difference between a second angle of the second sidewall with respect to the main surface of the substrate, and the first angle being in a range of 1° to 25°;
an interlayer insulating film disposed on the trench structure;
a source electrode common to and in contact with surfaces of the source region and the contact region; and
a drain electrode provided on the rear surface of the substrate, wherein
the first wide bandgap semiconductor layer includes a first conductivity type region at the first side thereof, the first conductivity type region facing the second side of the second wide bandgap semiconductor layer and having an impurity concentration higher than the impurity concentration of the first wide bandgap semiconductor layer, and
the first base region and the second base region are disposed in the first conductivity type region, a bottom surface of the first base region at a side facing the substrate and a bottom surface of the second base region at a side facing the substrate being located within the first conductivity type region of the first wide bandgap semiconductor layer in a depth direction thereof.

8. The semiconductor device according to claim 7, wherein the second angle is in a range of 65° to 89°.

9. The semiconductor device according to claim 7, wherein a difference between the first angle and the second angle is in a range of 15° to 25°.

10. The semiconductor device according to claim 7, wherein a bottom of the first base region and a bottom of the second base region, each having a same depth of the first wide bandgap semiconductor layer relative to a surface of the first side thereof.

11. The semiconductor device according to claim 7, wherein an impurity concentration of the first base region and an impurity concentration of the second base region are the same.

12. The semiconductor device according to claim 7, wherein each of the substrate, the first wide bandgap semiconductor layer and the second wide bandgap semiconductor layer is made of a semiconductor material including silicon carbide.

* * * * *